US009510122B2

(12) United States Patent
Su et al.

(10) Patent No.: US 9,510,122 B2
(45) Date of Patent: Nov. 29, 2016

(54) ELECTRONIC DEVICE, AND CALIBRATION SYSTEM AND METHOD FOR SUPPRESSING NOISE

(71) Applicant: MStar Semiconductor, Inc., Hsinchu Hsien (TW)

(72) Inventors: Yu-Jen Su, Chupei (TW); Cheng-Lun Hu, Chupei (TW); Chih-Chun Lin, Chupei (TW)

(73) Assignee: MStar Semiconductor, Inc., Hsinchu Hsien (TW)

(*) Notice: Subject to any disclaimer, the term of this patent is extended or adjusted under 35 U.S.C. 154(b) by 145 days.

(21) Appl. No.: 14/505,544

(22) Filed: Oct. 3, 2014

(65) Prior Publication Data

US 2015/0100309 A1 Apr. 9, 2015

(30) Foreign Application Priority Data

Oct. 4, 2013 (TW) ............................. 102136075 A

(51) Int. Cl.
*H04R 29/00* (2006.01)
*H03G 3/32* (2006.01)
*G10L 21/02* (2013.01)

(52) U.S. Cl.
CPC .................................. *H04R 29/006* (2013.01)

(58) Field of Classification Search
CPC ................................ G10L 1/226; G10L 1/02
See application file for complete search history.

(56) References Cited

U.S. PATENT DOCUMENTS 7,162,420 B2 * 1/2007 Zangi ...................... G10L 21/02 375/232
7,227,565 B2 * 6/2007 Kawahara .............. H04N 7/142 348/14.02
8,964,998 B1 * 2/2015 McClain .................. H03G 3/32 381/106
2004/0133421 A1 * 7/2004 Burnett ................... G10L 21/02 704/215
2011/0172996 A1 * 7/2011 Takano ............... G10L 21/0208 704/225
2011/0176690 A1 * 7/2011 Takano .................. H04R 3/005 381/92
2012/0045074 A1 * 2/2012 Li ....................... G10L 21/0208 381/94.1
2012/0308040 A1 * 12/2012 Thormundsson ...... H04R 3/005 381/92
2014/0122504 A1 * 5/2014 Courtier-Dutton G06F 17/30038 707/748

FOREIGN PATENT DOCUMENTS

TW 201212659 A 3/2012

OTHER PUBLICATIONS

Google Translate, Patent Specification, Title: Reducing Ambien noise of the system, method and apparatus for the application of system, method and apparatus with environmnet noise cancellation. Sep. 14, 2010.*
Taiwan Office Action, May 15, 2015 4 pages.

* cited by examiner

*Primary Examiner* — Marivelisse Santiago Cordero
*Assistant Examiner* — Daryl Jackson
(74) *Attorney, Agent, or Firm* — Edell, Shapiro & Finnan, LLC

(57) ABSTRACT

A calibration system built in an electronic device with noise suppression is provided. The calibration system includes a first audio receiving module, a second audio receiving module and a correction module. The correction module corrects an adjustment value of the first audio receiving module and the second audio receiving module. The adjustment value is for adjusting gains of audio received results of the first audio receiving and second audio receiving.

17 Claims, 3 Drawing Sheets

ELECTRONIC DEVICE, AND CALIBRATION SYSTEM AND METHOD FOR SUPPRESSING NOISE

This application claims the benefit of Taiwan application Serial No. 102136075, filed Oct. 4, 2013, the subject matter of which is incorporated herein by reference.

BACKGROUND OF THE INVENTION

1. Field of the Invention

The invention relates in general to a method for processing a component error, and more particularly to a method for calibrating multiple audio receivings for noise suppression.

2. Description of the Related Art

Mobile applications have become more and more common with constant lightweight and miniaturization development trends of electronic devices. Small-size electronic devices, such as cell phones and tablet computers, can be applied for voice communication in various occasions. These occasions may be extremely quite or may contain diversified background noises. If the electronic device applied has only one single audio receiving module, such background noises may be recorded during the voice communication to possibly cover a sound from a speaker. The speaker may then need to raise the voice volume in order to allow a recipient to hear the speaker clearly. However, in certain public occasions, raising the voice volume may be an impolite gesture, and private contents of the voice communication may also be inappropriate to be heard by others nearby.

In view of the above reasons, more up-to-date electronic devices are usually equipped with multiple audio receiving modules. With a position difference between two audio receiving modules, background noises can be filtered out such that a speaker need not raise the voice volume. FIG. 1 shows a schematic diagram of a conventional electronic device 100, which may be a common cell phone.

In FIG. 1, a head of a user (speaker) is depicted, and the electronic device 100 is closely located near one side of the face of the user. The electronic device 100 includes a first audio receiving module 110 at one end and an audio speaker module 120 at the other end. The electronic device 100 further includes a second audio receiving module 112 at a position farther away from the first audio receiving module 110. In general, the first audio receiving module 110 and the audio speaker module 120 are located at one side of the face, and the second audio receiving module 112 is located at an opposite side of the electronic device 100. In practice, the second audio receiving module 112 may be located at another position of the electronic device 100, e.g., right at top of the electronic device 100.

The mouth of the user is an audio source 102. When the user makes a sound, sound waves sequentially reach the first audio receiving module 110 and the second audio receiving module 112. Background noises that are simultaneously formed may be regarded as simultaneously arriving the first audio receiving module 110 and the second audio receiving module 112. The first audio receiving module 110 is closer to the audio source 102 than the second audio receiving module 112, and the second audio receiving module 112 is located at an outer side of the user face instead of at an inner side of the user face as the first audio receiving module 110. Thus, a processing module (not shown) in the electronic device 100 can compare audio signals received by the two audio receiving modules 110 and 112 using signal processing. As the background noises reduced by the two audio receiving modules 110 and 112 are substantially the same, the difference between the two is the sound from the audio source 102. Further, when the user does not make a sound while the remote-end audio speaker module 120 sends a sound, the processing module (not shown) in the electronic device 100 may also filter out the sound from the remote end by signal processing. The above noise suppression and algorithm are commonly referred to as a non-stationary noise suppression (NSS) algorithm.

Due to the NSS algorithm, the first audio receiving module 110 and the second audio receiving module 112 utilized by the electronic device 100 adopt audio receiving modules with the same design, or at least audio receiving modules designed with the same gain. However, owing to material selections or errors generated during the manufacturing process, the gains of the first audio receiving module 110 and the second audio receiving module 112 are not necessarily the same. For example, a current acceptable error range of the cell phone manufacturing field is approximately ±3 dB. However, at higher costs, a manufacturer of the electronic device 100 may also obtain a batch of audio receiving modules having a smaller error range, e.g., ±2 dB or even ±1 dB.

Based on industrial design of the electronic device 100, including position factors of the first audio receiving module 110 and the second audio receiving module 112 relative to the audio source 102 as well as error ranges guaranteed by the specific batch of audio receiving modules, the manufacturer calibrates/corrects the electronic devices 100 of every module/batch to generate an audio adjustment value X for the first audio receiving module 110 and the second audio receiving module 112.

Having generated the audio adjustment value X for the electronic device 100 of a particular form, the manufacturer sets the audio adjustment value X into the electronic device 100 of that form. Although being quite convenient, such design has not considered different errors of individual electronic devices 100, meaning different errors in the gains of the first audio receiving module 110 and the second audio receiving module 112 of individual electronic devices 100 may not be properly handled. Consequently, noise suppression effects reflected on individual electronic devices 100 are also inconsistent.

In addition, the audio adjustment value X is obtained by the calibration/correction on the basis of an ideal distance between the electronic device 100 and the audio source 102. In actual applications, as head shapes of users and holding gestures of users may be different, respective distances from the first audio receiving module 110 and the second audio receiving module 112 to mouths of the users are inevitably different from the above ideal distance. Even for the same user, gestures that the user holds the electronic device 100 may also vary.

In summary, with the presence of gain differences between multiple audio receiving modules as well as different application conditions, the result of noise suppression may not be ideal as expected when the audio adjustment value in a constant value X is used as a noise suppression parameter. Therefore, there is a need for a method for calibrating multiple audio receiving modules and for recalibrating an audio adjustment value for individual electronic devices 100 and a user to enhance a noise suppression effect.

SUMMARY OF THE INVENTION

According to an embodiment of the present invention, a calibration system applied to an electronic device with noise suppression is provided. The calibration system includes a first audio receiving module, a second audio receiving module and a correction module. The correction module corrects an adjustment value for the first audio receiving module and the second audio receiving module. The adjustment value is for adjusting gains of audio received results of the first audio receiving module and the second audio receiving module.

According to another embodiment of the present invention, a calibration method is provided for an electronic device with noise suppression to perform self-calibration. The calibration method includes receiving a first audio received result, receiving a second audio received result, and correcting an adjustment value according to the first and second audio received results. The adjustment value is for adjusting gains of the first and second audio received results.

According to another embodiment of the present invention, an electronic device with noise suppression is provided. The electronic device includes a first audio receiving module, a second audio receiving module, and a correction module. The correction module corrects an adjustment value for the first audio receiving module and the second audio receiving module. The adjustment value is for adjusting gains of audio receiving results of the first audio receiving module and the second audio receiving module.

The above and other aspects of the invention will become better understood with regard to the following detailed description of the preferred but non-limiting embodiments. The following description is made with reference to the accompanying drawings.

DETAILED DESCRIPTION OF THE INVENTION

Embodiments of the present invention are described in detail below. Apart from the disclosed embodiments, the present invention is also applicable to other embodiments. The scope of the present invention is not limited by these non-limiting embodiments, and is defined in accordance with the appended claims. To better describe the contents of the present invention to one person skilled in the art and to keep the drawings clear, parts of the drawings are not drawn to actual sizes and ratios, and certain sizes and other associated scales may be emphasized to appear exaggerated, with unrelated details not entirely depicted.

One feature of the present invention is that, multiple audio receiving modules of an electronic device are calibrated/corrected by using a signal processing module in the electronic device. As the calibration/correction is carried out in individual electronic devices, differences of these electronic devices may be calibrated/corrected individually instead of universally applying one constant audio adjustment value X. Further, the calibration may be dynamically performed according to application habits of users. Thus, the calibration can be conducted according to not only component performance differences of individual electronic devices but also application habits of individual users, thereby yielding a preferred non-stationary noise suppression (NSS) effect.

Figure 1:
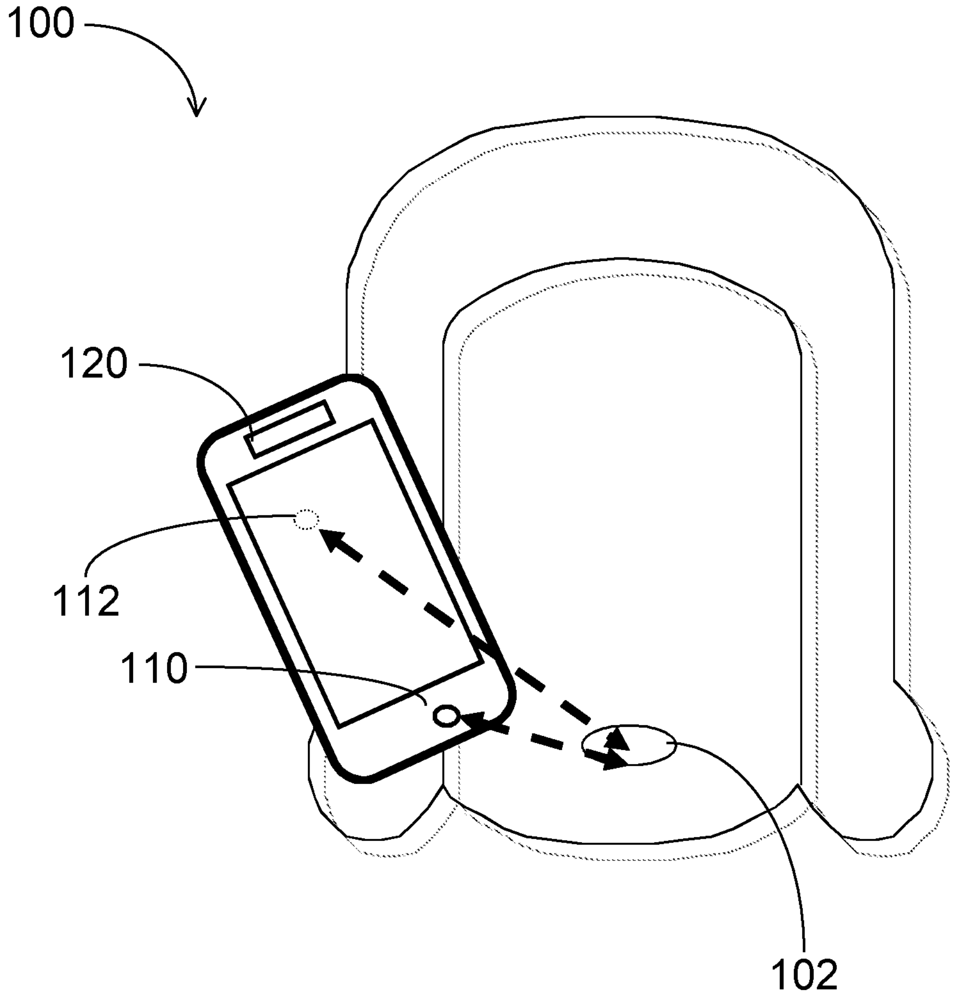
FIG. 1(prior art)
FIG. 1 is a schematic diagram of a conventional electronic device.
Figure 2:
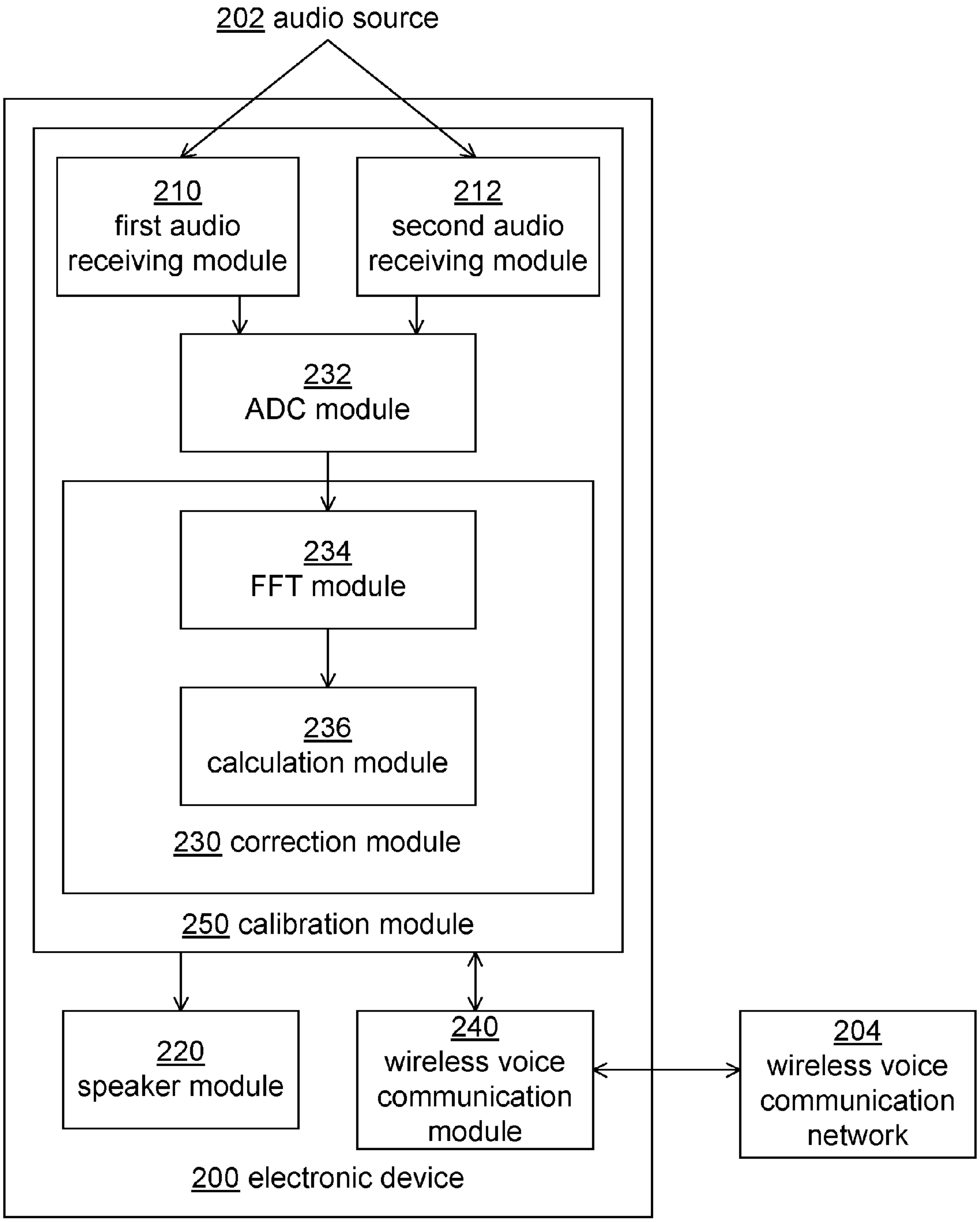
FIG. 2 is a block diagram of an electronic device according to an embodiment of the present invention.

FIG. 2 shows a block diagram of an electronic device 200 according to an embodiment of the present invention. The electronic device 200 may be an electronic device having multiple audio receiving modules, e.g., a cell phone, a tablet computer, or a desktop smart phone connected to a wired communication system. Although a cell phone is utilized as an example in the present invention, one person skilled in the art can easily understand that the present invention is applicable to any electronic device utilizing multiple audio receiving modules for performing an NSS algorithm.

The electronic device 200 receives an audio input of a user, and expects to receive the audio input of the user via an audio source 202. The audio source 202 is usually the mouth of the user. The electronic device 200 includes a calibration module 250, a wireless voice communication module 240, and a speaker module 220. The calibration module 250 includes a first audio receiving module 210 and a second audio receiving module 212 that receive an audio input from the external. The calibration module 250 further includes a correction module 230 that corrects an adjustment value for the first audio receiving module 210 and the second audio receiving module 212. The adjustment value is for adjusting gains of audio received results of the first audio receiving module 210 and the second audio receiving module 212.

In one embodiment, the first audio receiving module 210 is closer to the audio source 202 than the second audio receiving module 212. For example, the first audio receiving module 210 is close to one end of the electronic device 200, and the second audio receiving module 212 is closer to the opposite end of the electronic device 200. In another embodiment, the first audio receiving module 210 is close to one side of the electronic device 200, and the second audio receiving module 212 is closer to the opposite side of the electronic device 200. In yet another embodiment, the second audio receiving module 212 may also be located at another position of the electronic device 200, e.g., right at the top of the electronic device 200. Regardless of the industrial design of the electronic device 200, the electronic device 200 is applicable to the present invention given that the first audio receiving module 210 is closer to the audio source 202 than the second audio receiving module 212.

As previously stated, the first audio receiving module 210 and the second audio receiving module 212 are usually audio receiving modules designed with the same gain or audio receiving modules having the same design. However, due to material selections and manufacturing errors, an error may exist between an actual gain and a designed gain of an audio receiving module. For example, audio receivings of the same manufacturer usually have a certain maximum error value, e.g., about ±3 dB. However, at higher costs, the manufacturer of the electronic device 100 may also obtain a batch of audio receiving modules having a smaller error range, e.g., ±2 dB or even ±1 dB. In the present invention, the foregoing ±3 dB is referred to as a larger (first) error tolerance, and the foregoing ±2 dB or ±1 dB is referred to a smaller (second) error tolerance.

In one embodiment, a maximum error tolerance of the first audio receiving module 210 is equal to a maximum error tolerance of the second audio receiving module 212. In other words, assuming the maximum error tolerance is ±3 dB, a possible maximum gain error between the first audio receiving module 210 and the second audio receiving module 212 is twice the maximum error tolerance, i.e., ±6 dB. Further, a possible minimum gain error is 0 dB.

In one embodiment, the industrial design of the electronic device 200 causes the gain of the first audio receiving module 210 for the audio source 202 to be higher than the gain of the second audio receiving 212 for the audio source 202, to a level that overcomes twice the maximum error tolerance. For example, according to the designed gain, for the sound from the audio source 202, the gain for the sound when transmitted to the first audio receiving module 210 is higher than the gain for the sound when transmitted to the second audio receiving 212 by 8 dB. More specifically, even when the gain error of the second audio receiving module 212 is higher than the gain error of the first audio receiving 210 by 6 dB, i.e., when actual gains of the second audio receiving module 212 and the first audio receiving module 210 differs by 2 dB, the electronic device 200 is still capable of detecting the sound sent from the audio source 202 from the background noise, with however the noise suppression effect being less satisfactory. If the actual gains of the actual gains of the second audio receiving module 212 and the first audio receiving module 210 are equal, the electronic device 200 is definitely capable of detecting the sound sent from the audio source 202 from the background noise, with the noise suppression effect being better. It should be noted that, the gain for one audio receiving may be a positive or a negative value. For example, amplifying the audio received result of one audio receiving module is equivalently reducing the audio received result of another audio receiving module.

In one embodiment, the electronic device 200 may connect to an external wireless voice communication network 204 via a wireless voice communication module 204, so as to communicate with an external remote end via the wireless voice communication network 204. The sound from the remote end is sent from a speaker module 220. One person skilled in the art can understand that, given voice communication can be carried, technologies of the wireless voice communication module 240 and the wireless voice communication network 204 are not limited.

As previously described, the manufacturer of the electronic device 200 calibrates/corrects the electronic device 200 to generate an audio adjustment value X for the first audio receiving module 210 and the second audio receiving module 212. While manufacturing the electronic device 200, the audio adjustment value X is inputted into the electronic device 200.

In one embodiment, the electronic device 200 selects various time points at which the audio source 202 sends out sounds to perform the calibration on the multiple audio receiving modules. The electronic device 200 includes a calibration module 250 to perform the calibration method. The calibration module 250 includes a first audio receiving module 210, a second audio receiving module 212, an analog-to-digital converter (ADC) module 232, and a correction module 230. The ADC module 232 receives analog audio signals received by the first audio receiving module 210 and the second audio receiving module 212.

The ADC module 232 converts the analog audio signals to digital audio signals. In one embodiment, the ADC module 232 has two channels for simultaneously converting the analog audio signals from the first audio receiving module 210 and the second audio receiving module 212. In another embodiment, the ADC module 232 has only one channel that converts the analog audio signals from first audio receiving module 210 and the second audio receiving module 212 in a time-shared manner.

In one embodiment, the ADC module 232 may include an analog amplifier that first amplifies the received analog audio signals before the analog audio signals are converted. In another embodiment, the ADC module 232 may include a digital amplifier that amplifies the converted digital audio signals. Details for amplifying or adjusting signal gains are generally known to one person skilled in the art, and shall be omitted herein.

In one embodiment of the present invention, the digital audio signal from the ADC module 232 may be forwarded to the speaker module 220 in a microphone calibration mode, e.g. echo loop mode. Through the ADC module 232 and a signal amplifier, the speaker module 220 may directly play the audio signals received by the first audio receiving module 210 and the second audio receiving module 212. In the echo loop mode of another embodiment, the audio signals received by the first audio receiving module 210 and the second audio receiving module 212 may be directly forwarded to the speaker module 220, which then directly plays the audio signals.

For both digital and analog signal transmission means, the echo loop mode is utilized. Generally speaking, in a production line of the electronic device 200, an installation and testing staff sets the electronic device 200 to the echo loop mode. The installation and testing staff then normally holds the electronic device 200 and speaks to the electronic device 200. If the installation and testing staff can clearly hear speeches given by himself/herself from the speaker module 220, it means that all components on the above digital/analog loop are functional. If the installation and testing staff cannot normally hear the speeches given by himself/herself from the speaker module 220, it means that at least one component on the digital/analog loop is malfunctioning. Accordingly, the installation and testing staff identifies the electronic device 200 with a defect.

The correction module 230 includes a fast Fourier transform (FFT) module 234 and a calculation module 236. The digital audio signals outputted from the ADC module 232 are forwarded to the FFT module 234. In one embodiment, the FFT module 234 simultaneously receives digital audio signals of two channels. In another embodiment, the FFT module 234 simultaneously performs FFT on digital audio signals of two channels. In another embodiment, the FFT 234 performs FFT on digital audio signals of two channels in a time-shared manner. The audio signals having undergone FFT can then be outputted as frequency-domain signals corresponding to the first audio receiving module 210 and the second audio receiving module 212 to the calculation module 236. Since the ADC 232 and the FFT 234 are constantly used to perform image processing in the electronic device 200, they can be applied for calibration and noise suppression of multiple audio receivings by the present invention without increasing costs.

According to the frequency-domain signals corresponding to the first audio receiving module 210 and the second audio receiving module 212, the calculation module 236 calculates an actual error value Z of the gains of the first audio receiving module 210 and the second audio receiving module 212. According to the audio adjustment value X and the actual error value Z, the calculation module 236 calculates a difference Y, and adjusts the audio adjustment value X according to the difference Y. In addition to reflecting the actual error value Z of the gains of the first audio receiving module 210 and the second audio receiving module 212, the adjusted audio adjustment value X further optimizes noise suppression according to a habit of the user holding the electronic device 200, i.e., according to the distances from the audio source 202 to the first audio receiving module 210 and the second audio receiving module 212.

In an example below, it is assumed that the error tolerance of the first audio receiving module 210 and the second audio receiving module 212 is ±3 dB, and the audio adjustment value X is initially set to 6 dB. In one embodiment, the difference Y is calculated to be the difference between the actual error value Z and the audio adjustment value X according to the actual error value Z calculated by the calculation module 236, i.e., Y=Z−X.

In one embodiment, when the value of the difference Y is greater than 6 dB or is smaller than −6 dB, i.e., when an absolute value of the difference Y is greater than twice the error tolerance, the audio adjustment value X is kept. In the above situation, it is possible that distances from the audio source 202 to the two audio receiving modules exceed the range, the error tolerance of the audio receiving modules exceeds the range, or there is an installation error. Thus, another round of calibration/correction on the electronic device 200 may be needed.

As previously stated, although the error tolerance of the first audio receiving module 210 and the second audio receiving module 212 is ±3 dB, at higher costs, the first audio receiving module 210 and the second audio receiving module 212 may have a preferred error tolerance, e.g., ±2 dB. It is apparent that such preferred error tolerance is smaller than the error tolerance.

In one embodiment, when the absolute value of the difference Y is between twice the error tolerance and twice the preferred error tolerance, the audio adjustment value X is added by a coefficient Coeff, i.e., X=X+Coeff. For example, when 6>Y>4, or −6>Y>−4, the audio adjustment value X is increased by a coefficient Coeff.

In one embodiment, the coefficient Coeff may be directly proportional to the difference Y. In another embodiment, the coefficient Coeff may be directly proportional to a factor of the difference Y, i.e., the audio adjustment value X=X+Y/F, where F is an arbitrary physical number. For example, F may be a constant 1.414.

In one embodiment, when the absolute value of the difference Y is between twice the preferred error tolerance and zero, the audio adjustment value X is made to equal the difference between the actual error value Z and the difference Y, i.e., X=Z−Y. For example, when −4<Y<4, the audio adjustment value X is adjusted to the difference between the actual error value Z and the difference Y.

Figure 3:
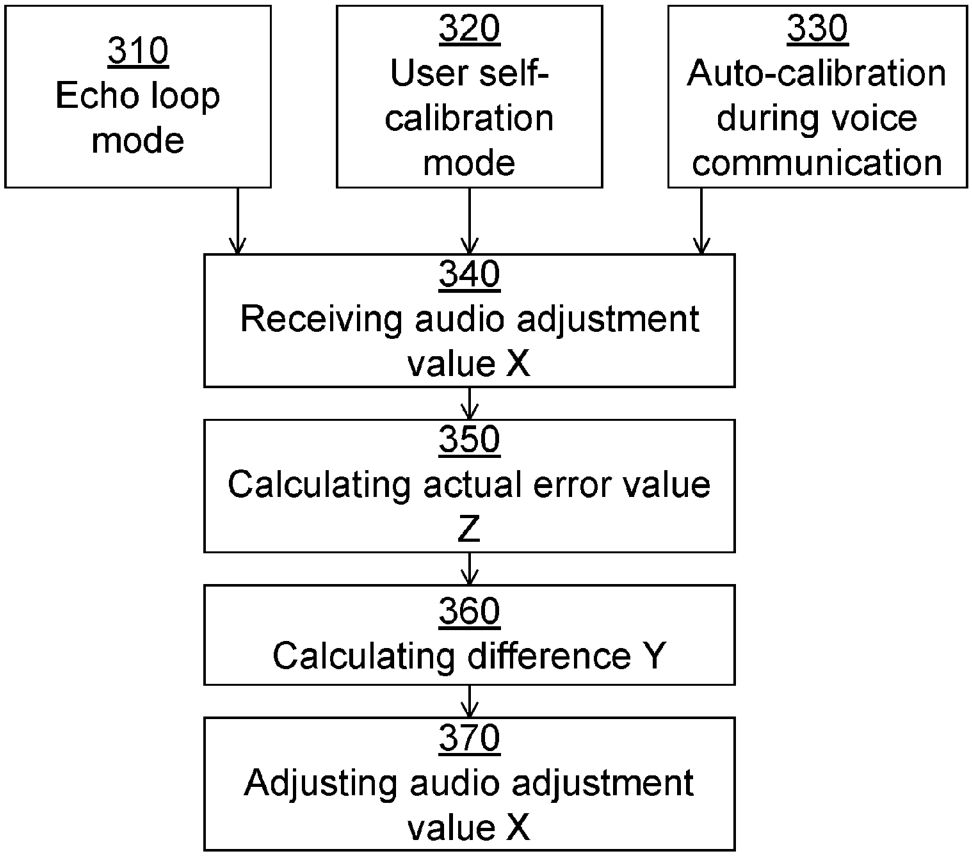
FIG. 3 is a flowchart of a method for correcting multiple audio receiving modules according to an embodiment of the present invention.

FIG. 3 shows a flowchart of a method for calibrating multiple audio receiving modules according to an embodiment of the present invention. In the present invention, there are three approaches for initiating the method for calibrating the multiple audio receiving modules. In step 310, the process enters an echo loop mode.

In general, the electronic device 200 is usually prompted to enter the echo loop mode by an installation and testing staff on the production line of the electronic device 200. As the installation and testing staff of the production line of the electronic device 200 originally utilizes the echo loop mode to test whether all components on the echo loop are functional, without involving an additional calibration procedure on the production line of the electronic device 200 of the present invention, the function of calibrating the multiple audio receivings can be achieved with the same test items and time. At the echo loop, the installation and testing staff normally holds the electronic device 200 to maintain the designed ideal distance between the audio source 202 and the first audio receiving module 210 as much as possible. The installation and testing staff then sends a sound to the electronic device 200, i.e., sending a specific sound via a machine, and listens to whether the speaker module 220 returns the sound previously sent. In one embodiment, the time for sending the sound is about 5 s. That is to say, a mode for sending the sound is a predetermined mode, which defines a predetermined time point for sending the sound, a predetermined audio range for sending the sound, and predetermined relative positions of the sound and the electronic device 200, for example.

Step 320 as another approach for entering the calibration method is for self-calibration of an individual electronic device 200. In the electronic device 200, the user may activate a self-calibration program for prompting the electronic device 200 to send a predetermined sound that causes the correction module 230 to perform subsequent steps. In one embodiment, the time for sending the sound is about 5 s. That is to say, a mode for sending the sound is a predetermined mode, which defines a predetermined time point for sending the sound, a predetermined audio range for sending the sound, and predetermined relative positions of the sound and the electronic device 200, for example. Similarly, step S320 may be additionally performed on the production line of the electronic device 200 to individually calibrate the electronic device 200.

In addition to the two steps for entering the calibration method, when the user voice communicates with a remote end on the wireless voice communication network 204 via the wireless voice communication module 240 of the electronic device 200, step 330 can also be simultaneously performed; that is, the voice of the user is utilized to perform auto-calibration during the voice communication. It should be noted that, given voice communication can be carried to perform auto-calibration during the voice communication, technologies of the wireless voice communication module 240 and the wireless voice communication network 204 are not limited. The electronic device 200 may perform the calibration method in every phase of the voice communication, or may perform the calibration method at a particular phase of the voice communication according to a user setting.

One benefit of performing the calibration method during the voice communication is that, the calibration can be performed according to actual conditions while the user holds the electronic device 200. It is unlikely that the user perform voice communication using the electronic device 200 for a long period of time—the user may relocate the electronic device 200 from one ear to the other, or may switch the hand for holding the electronic device 200 to the other hand. Even when holding the electronic device 200 with the same hand, the holding gesture may be changed due to tiredness. When the calibration method is dynamically performed, the above changes can be in real-time and dynamically calibrated to maintain or enhance the noise suppression effect.

The calibration method can be initiated via the three different steps 310, 320 and 330. Next, step 340 is performed to receive an audio adjustment value X. In one embodiment, the audio adjustment value X may be an audio adjustment value X that the manufacturer of the electronic device 200 obtains for the electronic device of that model by a preliminary calibration process. In another embodiment, the audio adjustment value X may be an audio adjustment X recorded after previously performing the calibration method.

In step 350, an actual error value Z of the first audio receiving module 210 and the second audio receiving module 212 is calculated. In following step 360, a difference Y is calculated according to the audio adjustment value X and the actual error value Z. In step 370, the audio adjustment value X is adjusted according to the difference Y. One person skilled in the art can easily understand that, calculation details in step 350, 360 and 370 may be performed according the description of the embodiment in FIG. 2, and shall be omitted herein.

Figure 4:
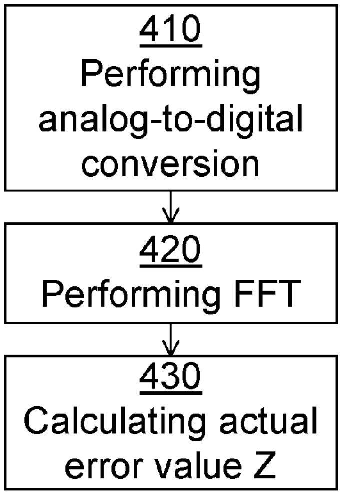
FIG. 4 is a flowchart of a method for calculating an actual error value Z according to an embodiment of the present invention.

FIG. 4 shows a flowchart of a method for calculating an actual error value Z according to an embodiment of the present invention. FIG. 4 may be regarded as an embodiment of step 350 in FIG. 3. In step 410, analog audio signals received by the first audio receiving module 210 and the second audio receiving module 212 may be converted to digital audio signals simultaneously or in a time-shared manner. In step 420, FFT is performed on the converted digital audio signals simultaneously or in a time-shared manner. In step 430, the actual error value Z is calculated according to frequency-domain signals obtained from FFT. One person skilled in the art can easily understand that, calculation details in step 410, 420 and 430 may be performed according to the description of the embodiment in FIG. 2, and shall be omitted herein.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A calibration system, applied to an electronic device with noise suppression, comprising:

a first audio receiving module comprising a first microphone, configured to receive a voice and to generate a first received result gained by an adjustment value;

a second audio receiving module comprising a second microphone, configured to receive the voice and to generate a second received result gained by the adjustment value; and a correction module, configured to correct the adjustment value;

wherein the electronic device performs noise suppression according to the first and second received results, wherein the first audio receiving module and the second audio receiving module have an error tolerance that is between a first error tolerance and a second error tolerance, the correction module calculates an actual error value from the first and second received results, and the adjustment value remains uncorrected when an absolute value of the actual error value is greater than twice an absolute value of the first error tolerance.

2. The calibration system according to claim 1, wherein the first audio receiving module is closer to a voice source than the second audio receiving module.

3. The calibration system according to claim 1, wherein the uncorrected adjustment value is twice the absolute value of the first error tolerance.

4. The calibration system according to claim 1, wherein when the absolute value of the actual error value is smaller than twice an absolute value of the second error tolerance, the correction module corrects the adjustment value using the actual error value.

5. The calibration system according to claim 1, wherein when the absolute value of the actual error value is between twice an absolute value of the second error tolerance and twice the absolute value of the first error tolerance, the correction module corrects the adjustment value using a coefficient, the coefficient is directly proportional to the actual error value.

6. The calibration system according to claim 1, wherein the electronic device further comprises a voice communication module configured to connect to a voice communication network, and the correction module performs real-time correction on the adjustment value when the electronic device connects to the voice communication network via the voice communication module.

7. The calibration system according to claim 1, further comprising:

an analog-to-digital converter (ADC) module, configured to convert the first and second received results from analog signals to digital signals;

wherein, the correction module further comprises:

a fast Fourier transform (FFT) module, configured to convert the digital signals outputted from the ADC module to frequency-domain signals; and a calculation module, configured to calculate an actual error value according to the frequency-domain signals outputted from the FFT module;

wherein the actual error value is related to the correction of the adjustment value.

8. A calibration method, applied to an electronic device with noise suppression to perform self-calibration, comprising:

receiving a voice and generating a first received result gained by an adjustment value;

receiving the voice and generating a second received result gained by the adjustment value; and correcting the adjustment value;

wherein the electronic device performs noise suppression according to the first and second received results, and wherein the first receiving result and the second received result have an error tolerance that is between a first error tolerance and a second error tolerance; the step of correcting the adjustment value according to the first and second received results comprises:

calculating an actual error value from the first and second received results; and remaining the adjustment value unadjusted when an absolute value of the actual error value is greater than twice an absolute value of the first error tolerance.

9. The calibration method according to claim 8, wherein a position at which the voice is received by the first audio receiving module is closer to an voice source than a position at which the voice is received by the second audio receiving module.

10. The calibration method according to claim 8, wherein the uncorrected adjustment value is twice the absolute value of the first error tolerance.

11. The calibration method according to claim 8, wherein the step of correcting the adjustment value according to the first and second received results further comprises:

correcting the adjustment value using the actual error value when the absolute value of the actual error value is smaller than twice an absolute value of the second error tolerance.

12. The calibration method according to claim 11, wherein the step of correcting the adjustment value according to the first and second received results further comprises:

correcting the adjustment value using a coefficient when the absolute value of the actual error value is between twice the absolute value of the second error tolerance and twice the absolute value of the first error tolerance, wherein the coefficient is directly proportional to the actual error value.

13. The calibration method according to claim 8, further comprising:

performing voice communication; and correcting the adjustment value in real-time during the voice communication.

14. The calibration method according to claim 8, further comprises:

converting the first and second received results from analog signals to digital signals;

converting the digital signals to frequency-domain signals; and calculating an actual error value according to the frequency-domain signals;

wherein the actual error value is related to the correction of the adjustment value.

15. An electronic device with noise suppression, comprising:

a first audio receiving module comprising a first microphone, configured to receive a voice and to generate a first received result gained by an adjustment value;

a second audio receiving module comprising a second microphone, configured to receive the voice and to generate a second received result gained by the adjustment value; and a correction module, configured to correct the adjustment value;

wherein, the electronic device performs noise suppression according to the first and second received results, and wherein the first audio receiving module and the second audio receiving module have an error tolerance that is between a first error tolerance and a second error tolerance, the correction module calculates an actual error value from the first and second received results, and the adjustment value is remained uncorrected when an absolute value of the actual error value is greater than twice an absolute value of the first error tolerance.

16. The electronic device according to claim 15, further comprising:

an analog-to-digital converter (ADC) module, configured to convert the first and second received results from analog signals to digital signals;

wherein, the correction module further comprises:

a fast Fourier transform (FFT) module, configured to convert digital signals outputted from the ADC module to frequency-domain signals; and a calculation module, configured to calculate an actual error value according to the frequency-domain signals outputted from the FFT module, and the actual error value is related to the correction of the adjustment value.

17. The electronic device according to claim 15, further comprising:

a voice communication module, configured to connect to a voice communication network;

wherein, the correction module performs real-time correction on the adjustment value when the electronic device connects to the voice communication network via the voice communication module.

* * * * *